United States Patent [19]

Rast et al.

[11] 4,077,008
[45] Feb. 28, 1978

[54] PHASE LOCKED LOOP TUNING SYSTEM WITH STATION SCANNING PROVISIONS

[75] Inventors: Robert Morgan Rast, Mercerville; Juri Tults, Princeton Junction, both of N.J.

[73] Assignee: RCA Corporation, New York, N.Y.

[21] Appl. No.: 733,673

[22] Filed: Oct. 18, 1976

[51] Int. Cl.² ............................................ H04B 1/16
[52] U.S. Cl. .................................. 325/421; 325/464; 325/470; 358/193; 358/195
[58] Field of Search ............... 325/335, 453, 464, 468, 325/470, 418–423; 358/191, 193, 195; 334/14–16

[56] References Cited

U.S. PATENT DOCUMENTS

| 3,962,640 | 6/1976 | Bomba | 325/421 |
|---|---|---|---|
| 4,009,439 | 2/1977 | Rast | 325/468 |

OTHER PUBLICATIONS

A uniquely Simplified T.V. Tuning System Incorporating an Equally Unique Digital Automatic & Manual Fine Tuning Scheme, Steve Hilliker, IEEE Trans. on Consumer Electronics, 2/1976, pp. 61–68.

Primary Examiner—Robert L. Griffin
Assistant Examiner—Marc E. Bookbinder
Attorney, Agent, or Firm—Eugene M. Whitacre; Paul J. Rasmussen; Peter M. Emanuel

[57] ABSTRACT

A tuning system for a television receiver includes a first phase locked loop configuration for controlling the frequency of the receiver's local oscillator signal in accordance with the number of the channel presently being tuned and a second phase locked loop configuration for controlling the frequency of the local oscillator signal to reduce any frequency deviation between the receiver's IF picture carrier and 45.75 MHz corresponding to a frequency offset between the associated RF carrier and the standard RF carrier frequency for the channel being presently tuned due to the frequency translation provided by a television distribution system. The tuning system includes control units for automatically changing the channel number and selectively enabling the operation of the first and second phase locked loop configuration in accordance with a tuning algorithm so that active channels may be automatically located and tuned while preventing the receiver from being erroneously tuned to undesirable signals.

12 Claims, 9 Drawing Figures

PHASE LOCKED LOOP TUNING SYSTEM WITH STATION SCANNING PROVISIONS

BACKGROUND OF THE INVENTION

The present invention is directed to the field of tuning systems including station scanning provisions.

Tuning systems for radio and television receivers with station scanning or signal seeking provisions which automatically locate and tune the receiver to stations which are capable of being received by the receiver are desirable in order to minimize the inconvenience to a user of manually searching for tunable stations. Scanning or signal seeking tuning systems are described, for example, in U.S. Pat. Nos. 3,845,394 entitled, "Broadcast Receiver" and issued in the name of O. Hamada on Oct. 29, 1974 and 3,931,579 entitled, "Digital Signal Seeking System," and issued in the name of Ma et al. on Jan. 6, 1976 and 3,936,753.

Not only should a tuning system of a receiver including scanning provisions locate and tune the receiver to stations which are capable of being tuned, but it should also be capable of preventing the receiver to be erroneously tuned to undesirable signals present in the intermediate frequency signal processing circuitry of the receiver. For example, without the proper precautions a television receiver employing a tuning system including channel scanning provisions may be erroneously tuned to adjacent channel carriers, signals containing a relatively large noise component or spurious signals due to intermodulation distortion or insufficient image rejection in the tuning circuitry of the receiver.

Moreover, it is desirable that a tuning system including scanning provisions to be capable of not only locating and tuning the receiver to carriers having standard broadcast frequencies, but it should desirably also be capable of locating and tuning the receiver to carriers having nonstandard frequencies arbitrarily offset from respective standard frequencies while also rejecting undesired signals. Carriers having nonstandard frequencies translated in frequency from respective standard frequency broadcast carriers associated with the various television channels a viewer may select may be produced when standard frequency broadcast carriers are processed by a television distribution system. A television tuning system including a phase locked loop configuration for generating the nominal frequency local oscillator signal to tune a receiver to the standard frequency associated with a channel selected by a viewer and another phase locked loop configuration, selectively enabled in accordance with a predetermined tuning algorithm, for reducing the frequency deviation between a picture carrier having a frequency offset from the nominal picture carrier frequency (e.g., in the United States 45.75 MHz) and the nominal picture carrier frequency is described in United States patent application Ser. No. 662,096 entitled, "Dual Mode Frequency Synthesizer for a Television Tuning Apparatus", filed in the name of R. M. Rast on Feb. 27, 1976.

SUMMARY OF THE INVENTION

In accordance with the present invention, a tuning system with provisions for scanning stations capable of being received by a receiver having local oscillator means for generating a local oscillator signal, mixer means for combining the local oscillator signal with a radio frequency carrier to derive an intermediate frequency signal having at least one information bearing carrier and intermediate frequency signal processing means with a predetermined passband, includes first phase locked loop means for controlling the frequency of the local oscillator signal in accordance with the number assigned to a station being tuned and a second phase locked loop means for controlling the frequency of the local oscillator signal to reduce a frequency deviation between the information bearing carrier and a fixed frequency. Scanning means selectively changes the station number until the amplitude of the radio frequency carrier is greater than a predetermined threshold value and the frequency of the dominant signal in the intermediate frequency passband is within a predetermined frequency deviation from the fixed frequency. Furthermore, under these conditions, the operation of the second phase locked loop is enabled.

DETAILED DESCRIPTION OF THE PREFERRED EMBODIMENT OF THE PRESENT INVENTION

Figure 1:
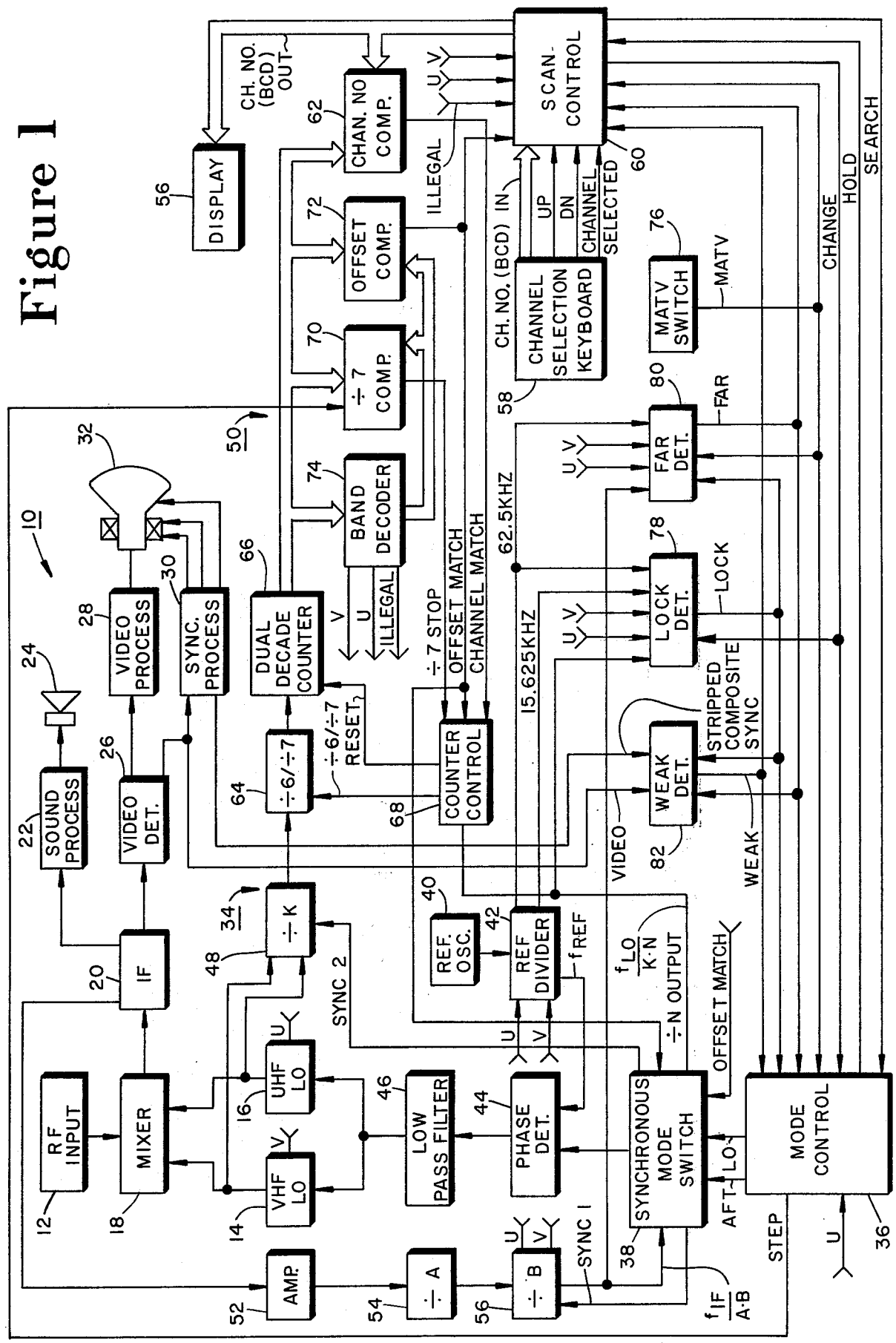
FIG. 1 is a block diagram of a television receiver employing a tuning system with scanning provisions constructed in accordance with the present invention.

A television receiver 10 shown in FIG. 1 includes a radio frequency (RF) signal input unit 12 for providing a modulated radio frequency (RF) carrier bearing television information. The RF carrier is combined with either an ultra high frequency (UHF) local oscillator signal provided by UHF local oscillator 16 or a very high frequency (VHF) local oscillator signal provided by a VHF local oscillator 14, depending on the frequency range of the RF carrier, in a mixer 18 to form an intermediate frequency (IF) signal. The IF signal passed by an IF amplifier 20 includes a modulated video or picture carrier bearing luminance and synchronization information, a modulated color carrier bearing chrominance information and a modulated sound carrier bearing sound information. The sound carrier is processed by a sound signal processing unit 22 to generate an audio frequency acoustic signal by means of a speaker 24. The remaining portions of the IF signal are detected by a video detector 26 and processed by a video signal processing unit 28 to form intensity modulated electron beams which are deflected in a raster scanning pattern by a synchronization signal processing unit 30 to form an image on the screen of a kinescope 32.

portions of receiver 10 thus far described may be formed in a manner similar to corresponding portions of the receiver disclosed in RCA Television Service Data, File 1975 C-10 for the CTC-74 chassis published by RCA Corporation, Indianapolis, Indiana.

RF input unit 12 may be coupled to an antenna for receiving off-the-air carriers having standard frequencies assigned (for example, in the United States by the Federal Communications Commission) to the various channels a viewer may select. RF input unit 12 may also be coupled to a television distribution system which provides carriers having nonstandard frequencies translated in frequency, by arbitrary amounts from respective standard frequency carriers. In order to tune receiver 10 to both standard and nonstandard frequency carriers, a tuning system 34 of receiver 10 includes first and second phase locked loop configurations which are selectively enabled and disabled by means of a mode control unit 36 and a synchronous mode switch 38 in accordance with a predetermined tuning algorithm. Certain portions of tuning system 34 are similar to corresponding portions of the dual mode tuning system described in the aforementioned Rast application, which is hereby incorporated by reference.

Common to both phase locked loop configurations are a reference oscillator 40, a reference divider 42, a phase detector 44, a low pass filter 46 and local oscillators 14 and 16. The remainder of the first phase locked loop configuration includes a divide-by-K prescaler 48 and a divide-by-N control unit 50, including blocks 62, 64, 66, 68, 70 and 72 to be later explained. When the divide-by-N output signal of divide-by-N control unit 50 is coupled to phase detector 44 through synchronous mode switch 38, the enabled local oscillator (i.e., either 14 or 16, depending on the frequency range in which the presently selected channel resides) is controlled in response to a DC control signal developed by low pass filtering the phase/frequency error signal generated by phase detector 44 until the phase and frequency of the divide-by-N output signal of divide-by-N control unit 50 are substantially equal to the phase and frequency of the reference frequency signal output of a reference divider 42. Under these conditions, the frequency of the local oscillator signal is defined by the expression:

$$f_{LO} = (KN/R) f_{XTAL} = KN f_{REF} \quad (1)$$

wherein
$f_{LO}$ is the local oscillator frequency;
$K$ is the factor by which divide-by-K prescaler 48 divides the frequency of the local oscillator signal;
$N$ is the factor by which divide-by-N control unit 50 divides the frequency of the output signal of divide-by-K prescaler 48;
$f_{XTAL}$ is the frequency of the output signal of the crystal oscillator comprising reference oscillator 40;
$R$ is the factor by which reference divider 42 divides the frequency, $f_{XTAL}$, of the output signal of reference oscillator 40 to generate the reference frequency output signal of reference divider 42; and
$f_{REF}$ is the frequency of the reference frequency output signal of reference divider 42.

Thus, assuming $f_{XTAL}$ is 4 MHz, R is set equal to 64 for channels in the VHF range and 256 for channels in the UHF range (since local oscillator frequencies for the UHF range are four times higher than local osciallator frequencies in the VHF range), and K is 16 for channels in the VHF range and 64 for channels in the UHF range, when the value of N for a selected channel is set equal to the nominal local oscillator frequency, in MHz, corresponding to the selected channel, the first phase locked loop configuration will synthesize the nominal frequency local oscillator signal required to tune receiver 10 to a standard frequency carrier.

In addition to the common portions of the first and second phase locked loops specified above, the remainder of the second phase locked loop includes mixer 18, IF processing unit 20, an amplifier 52, a divide-by-A divider 54 and a divide-by-B divider 56. When the output signal of divide-by-B divider 56 is coupled to phase detector 44 through synchronous mode switch 38, the enabled local oscillator is controlled in response to the DC control signal developed by phase detector 44 and low pass filter 46 until the phase and frequency of the reference output signal and the phase and frequency of the output signal of divide-by-B divider 56 are substantially equal. Under these conditions, the frequency of the dominant carrier in the IF passband is defined by the expression:

$$, f_{IF} = (AB/R) f_{XTAL} = AB f_{REF} \quad (2)$$

wherein
$f_{IF}$ is the frequency of the dominant carrier in the IF passband;
$A$ is the factor by which divide-by-A divider 54 divides the frequency of the dominant carrier in the IF passband; and
$B$ is the factor by which divide-by-B divider 56 divides the frequency of the output signal of divide-by-A divider 54.

Assuming that the values of $f_{XTAL}$ and R are as specified above and A is set equal to 1 for channels in the VHF range and 4 for channels in the UHF range and B is equal to 183 for all the channels, the frequency $f_{IF}$ will be equal to 45.75 MHz, i.e., the nominal picture carrier frequency in the United States. Thus, assuming that the dominant carrier in the IF passband is the picture carrier, the second phase locked loop configuration tunes the enabled local oscillator to minimize a frequency deviation between the frequency of the picture carrier and its nominal value.

An MATV switch 76 is provided by which a viewer may selectively enable tuning system 34 to tune receiver 10 to tunable nonstandard frequency carriers which are arbitrarily near, within a first predetermined range as great as, e.g., ±2 MHz, respective standard frequency carriers. Carriers having frequencies as far as ±2 MHz from the frequencies of respective standard frequency carriers may be provided, for example, by an MATV (master antenna television) distribution system. Thus, MATV switch 76 should be placed in an MATV enable position when RF input unit 12 is coupled to an MATV distribution system which may provide carriers having frequencies as far away as ±2 MHz from respective standard frequency carriers. Normally, however, when RF input unit 12 is coupled to a conventional off-the-air receiving antenna which provides standard frequency carriers or when RF input unit 12 is coupled to a cable distribution system which provides carriers only slightly translated in frequency from respective standard frequency carriers, MATV switch 76 should be placed in a disable position. Under these conditions, tuning system 34 will tune receiver 10 to tunable RF carriers within a second predetermined range, e.g., ±0.4 MHz, of respective standard frequency carriers. In the following description of the operation of tuning system 34, it is first assumed that MATV switch 76 is in the MATV enable position. Thereafter, the operation of tuning system 34 will be explained assuming that MATV switch 76 is in the MATV disable position.

Figure 2:
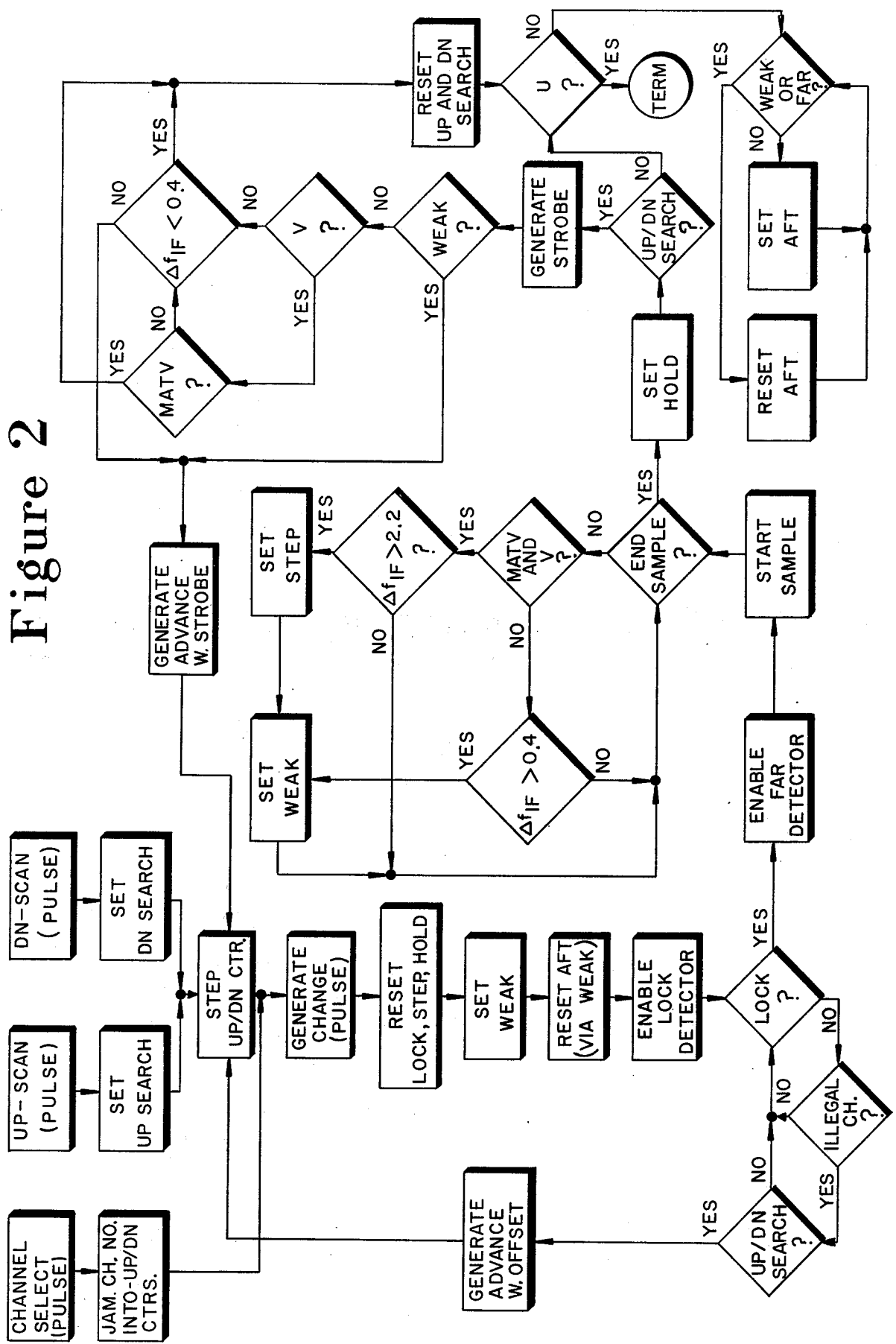
FIG. 2 is a flow chart of the operation of the tuning system shown in FIG. 1 and various portions thereof shown in FIGS. 6–9.
Figure 3:
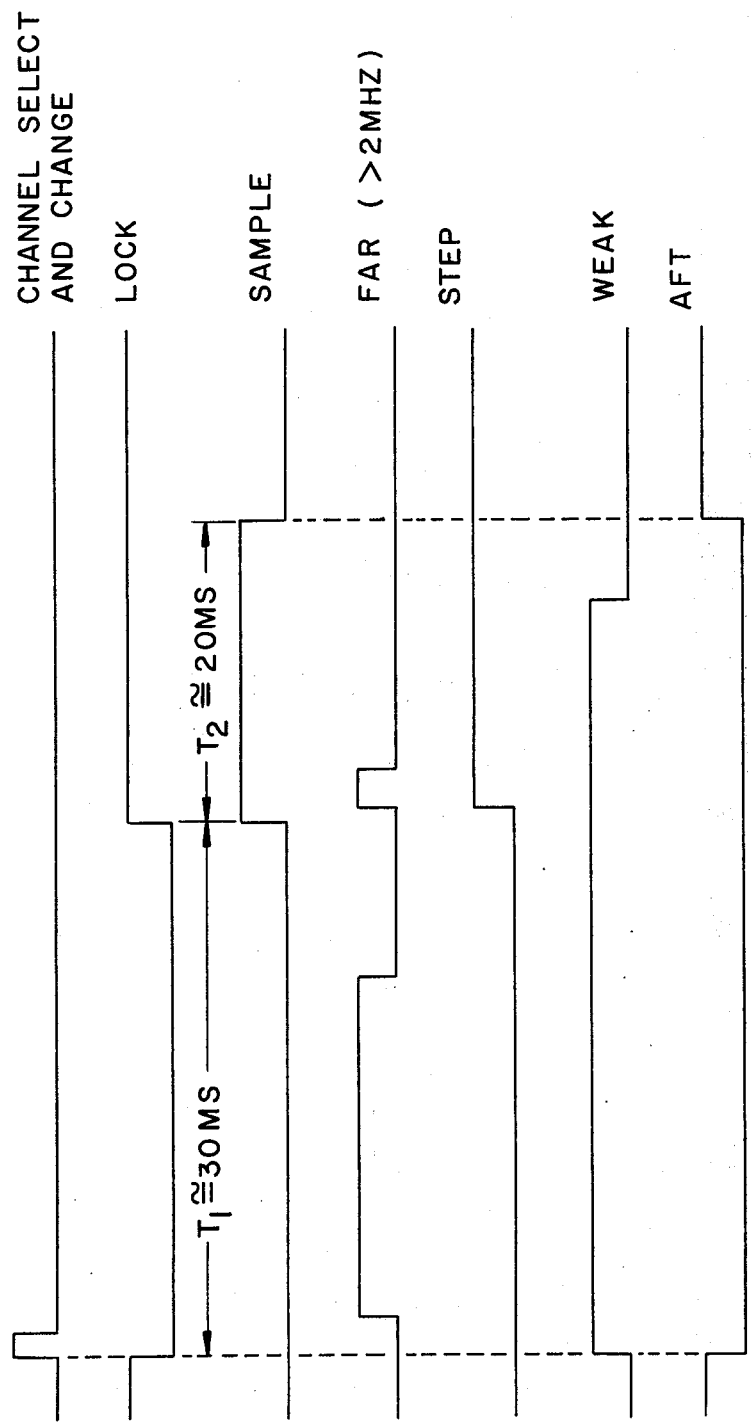
FIGS. 3–5 are graphical representations of waveforms associated with the operation of the tuning system shown in FIG. 1 and various portions thereof shown in FIGS. 6–9.
Figure 4:
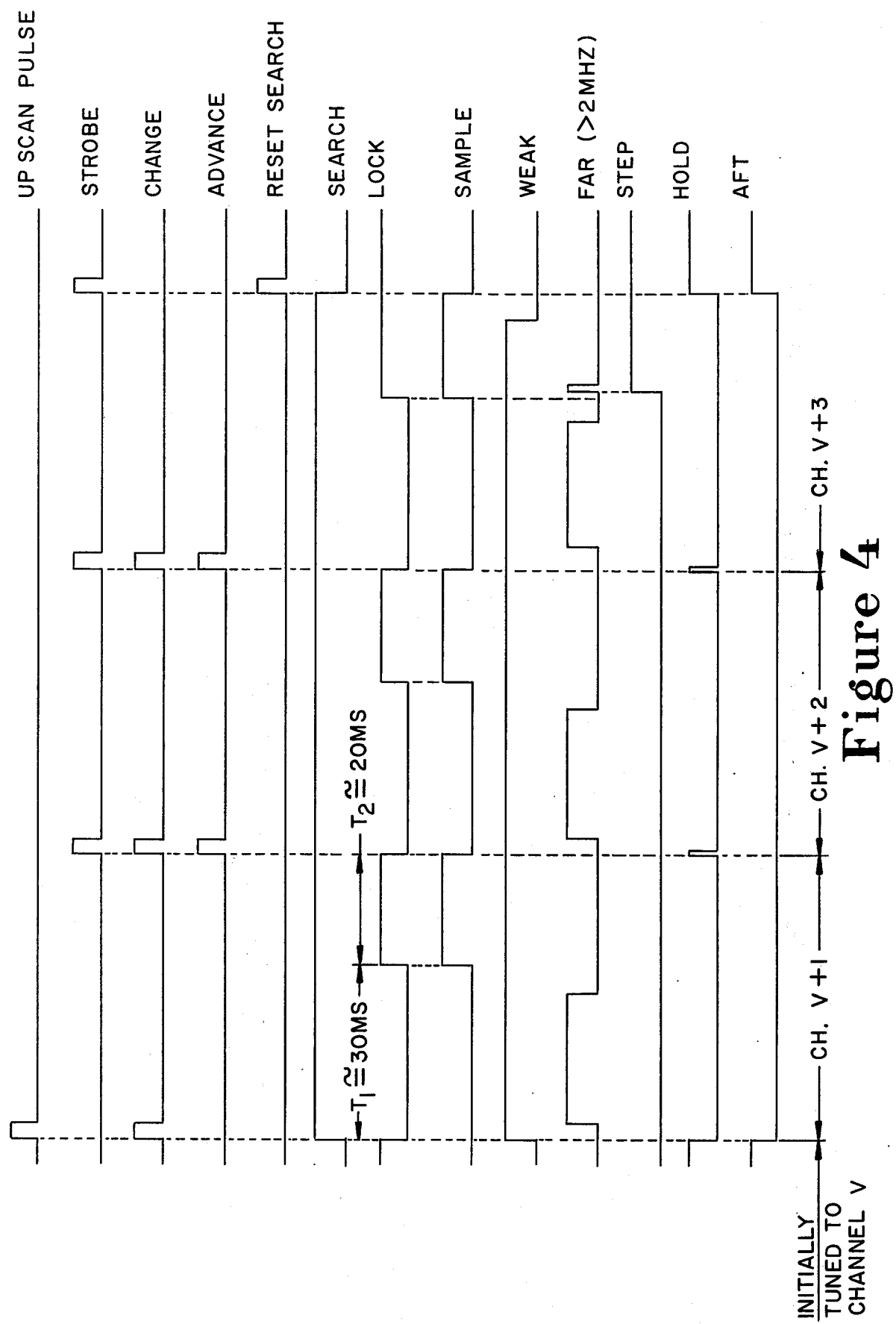
Figure 5:
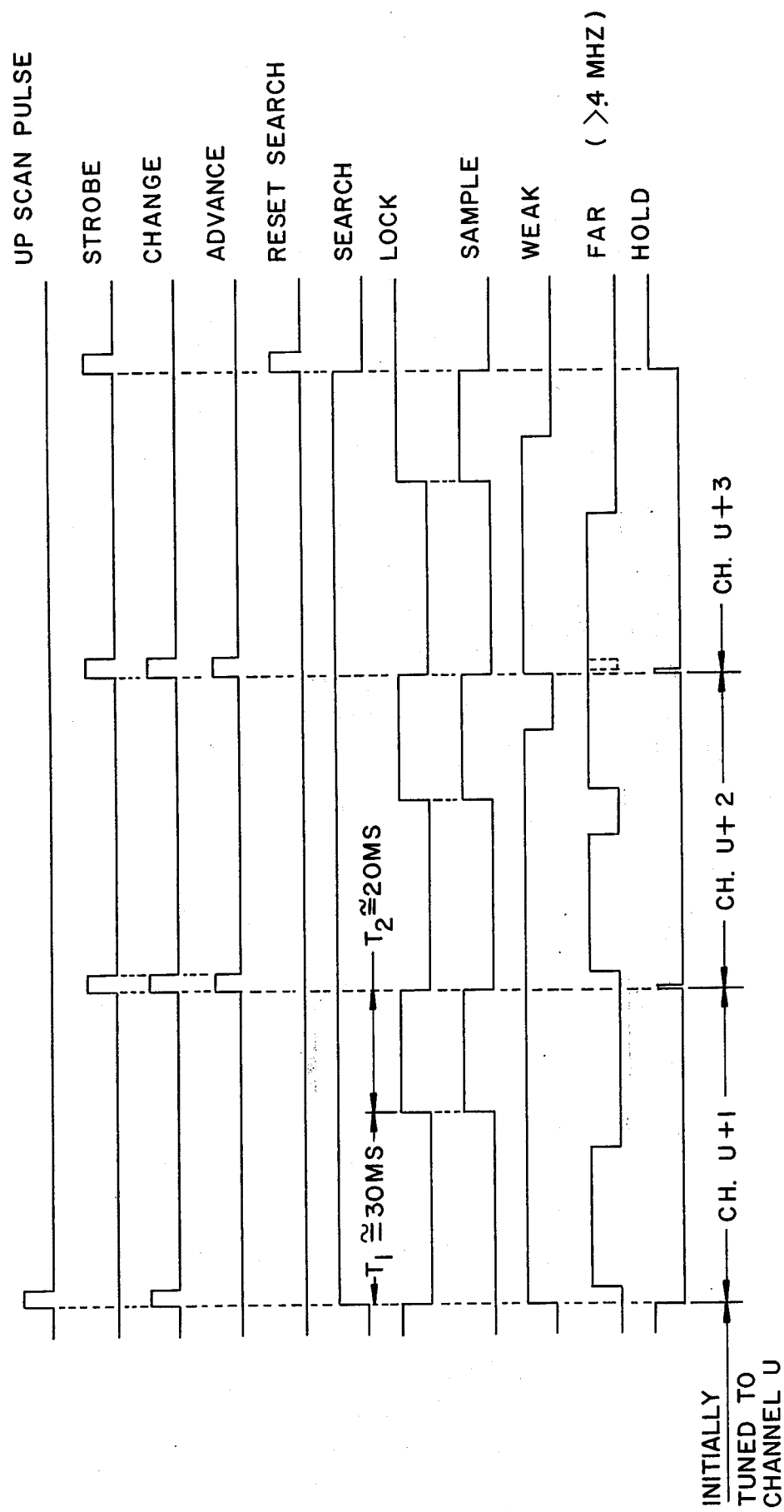

Channels capable of being received by the receiver, e.g., in the United States channels 2-83, may be manually selected or automatically located in response to the depression of control keys on channel selection keyboard 58. In the following description of the operation of tuning system 34, concurrent reference of FIG. 1, FIG. 2 and either FIG. 3, FIG. 4 or FIG. 5 is helpful.

Manual channel selection is initiated (see FIG. 3) by sequentially depressing the two decimal digits of the desired channel number. Channel selection keyboard 58 converts the two digit decimal number into eight binary coded decimal (BCD) signals. Four of the BCD signals represent the least significant decimal digit and another four represent the most significant digit. At the completion of the conversion, channel selection keyboard 58 generates a CHANNEL SELECTED pulse. In response, a scan control unit 60 generates a CHANGE pulse which is coupled to mode control unit 36. In response to the CHANGE pulse, as will be explained, certain portions of tuning system 34 are initialized and mode control unit 36 is caused to generate a LO (Local Oscillator) control signal which causes synchronous mode switch 38 to couple the divide-by-N output signal of divide-by-N control unit 50 to phase detector 44, thereby initiating the operation of the first phase locked loop configuration.

Furthermore, in response to the CHANNEL SELECTED pulse, the BCD channel number representative signals are coupled through scan control unit 60 to a display unit 56 and a channel number comparator 62 of divide-by-N control unit 50. Display unit 56 provides a visual indication of the selected channel to the viewer. Divide-by-N control unit 50, in addition to dividing the frequency of the output signal of divide-by-K prescaler 48 by a factor N determined from the channel number, generates a signal V if the selected channel is in the VHF range, a signal U if the selected channel is in the UHF range and an ILLEGAL signal if the selected channel number is not a proper one, e.g., in the Unites States, channel numbers 0, 1 and any number greater than 83, which are coupled to various portions of tuning system 34.

After the selection of a channel and the initiation of the operation of the first phase locked loop, the frequency of the local oscillator signal is controlled under the control of the first phase locked loop until a locked condition is reached, i.e., the frequency of the divide-by-N output signal of divide-by-N control unit 50 is substantially equal to the frequency of the reference signal. This occurrence is manifested when a lock detector 78, which has previously been reset to produce a $\overline{\text{LOCK}}$ (i.e., a not locked) signal in response to the CHANGE signal, generates a LOCK signal. To accomplish this, as will be subsequently explained in greater detail with reference to the arrangement of FIG. 6, lock detector 78 determined how many cycles of either a first reference frequency (e.g., 62.5 KHz) signal or a second reference frequency (e.g., 15.625 KHz) signal, depending on the band in which the selected channel resides, occur during one cycle of a signal whose frequency is equal to the difference between the frequency of the enabled reference frequency signal and the frequency of the divide-by-N output signal. If the number of cycles detected is large, the frequency difference between the divide-by-N output signal and the enabled reference frequency signal is small and a LOCK signal is generated.

Lock detector 78 is arranged in a manner so that a LOCK signal is not generated for a predetermined time interval, $T_1$. This interval is desirably selected long enough, e.g., 30 milliseconds, to permit the automatic gain control (AGC) signals of receiver 10 to settle in order to ensure that RF input unit 12 and IF signal processing unit 20 are operating under stable conditions when the other tuning conditions are examined. After the generation of a LOCK signal, a SAMPLE signal having a predetermined duration, $T_2$, is generated. The duration of the SAMPLE signal is desirably selected long enough to permit the other tuning conditions to be properly evaluated by respective portions of tuning system 34. After the termination of the SAMPLE signal, a HOLD signal is generated, thereby placing tuning system 34 in a steady state condition while the tuning conditions are examined to determine the next step in the tuning sequence.

A far detector 80 determines whether or not, for a particular value of N, there is a dominant carrier (i.e., the carrier having the largest amplitude) within a predetermined deviation of the nominal picture carrier frequency, e.g., in the United States 45.75 MHz. When MATV switch 76 is in the enable position, the predetermined deviation is ±2 MHz. When MATV switch 76 is in the disable position or when the selected channel is in the UHF range, the predetermined deviation is ±0.4 MHz. As will be explained in greater detail with reference to the arrangement of FIG. 2, far detector 80 operates in a similar fashion to lock detector 78 and determines how many cycles of a reference frequency (e.g., 62.5 KHz) signal occur during a signal the frequency of which is equal to the difference between the frequency of the reference frequency signal and the frequency of the output signal of divide-by-B divider 56. If the number of clock cycles counted is less than a predetermined count, corresponding to approximately 2 MHz, a FAR signal is generated. Lock detector 78 and far detector 80 share common elements. Therefore, after the completion of the lock detection function, the LOCK signal is coupled to far detector 80 to enable its operation.

A weak detector 82 is provided to generate a WEAK signal when the strength of the RF input signal is insufficient, e.g., below 50 microvolts, to prevent the operation of the second phase locked loop configuration. In essence, as will be more fully explained later with reference to the arrangement of FIG. 3, weak detector 82 is coupled to the synchronization signal processing unit 30 and video detector 26 to measure the average amount of noise present in the video signal during the vertical retrace interval. The duration of the SAMPLE signal is desirably selected longer, e.g., 20 milliseconds, than the period, e.g., 16 milliseconds, of the vertical field to permit a proper weak signal evaluation. The amount of noise present in the video signal during the vertical retrace interval is relatively small under strong signal conditions and relatively large under weak signal conditions. Weak signal detector 82 is used to inhibit the operation of the second phase locked loop configuration because, under weak signal conditions the counters which comprise divide-by-A divider 54 and divide-by-B divider 56 may not operate properly when relatively large amounts of noise are present in the IF signal. The $\overline{\text{LOCK}}$ signal generated by lock detector 78 is coupled to weak detector 82 to inhibit the generation of $\overline{\text{WEAK}}$ (i.e., not WEAK) signals, thereby inhibiting the operation of the second phase locked loop, when the operation of the first phase locked loop is initiated. Furthermore, the FAR signal generated by far detector 80 is coupled to weak detector 82 to inhibit the generation of a $\overline{\text{WEAK}}$ signal, thereby inhibiting the operation of the second phase locked loop (for reasons to be explained), when the dominant carrier is greater than the predetermined frequency deviation from the nominal picture carrier frequency.

Lock detector 78, weak detector 80 and far detector 82 are coupled to mode control unit 36 to determine which phase locked loop configuration is enabled. Furthermore, weak detector 80 and far detector 82 are coupled to scan control unit 60 to control the scanning mode of operation.

Assuming that RF input unit 12 is coupled to an MATV distribution system providing nonstandard frequency carriers arbitrarily near, within a predetermined range, e.g., ±2 MHz, respective standard frequency carriers, for any selected channel four tuning conditions may exist. Firstly, the selected channel may not be an active one. That is, there may be no RF carrier present for the selected channel. Under these conditions, noise signals having frequency components in the passband of IF signal processing unit 20 relatively close to the nominal picture carrier frequency, e.g., 45.75 MHz, will cause far detector 80 to generate a $\overline{FAR}$ (i.e., not FAR) signal, and weak detector 82 to generate a WEAK signal during the duration of the SAMPLE signal. If tuning system 34 is not in its scanning mode, the WEAK signal will cause the operation of the second phase locked loop configuration to be inhibited and the tuning sequency or algorithm will be complete. At this point, a viewable image will not be produced by kinescope 32 and a viewer must manually select another channel. However, as will later be described, if tuning system 34 is in it scanning mode, the next highest or lowest channel will be automatically examined to determine whether or not it is tunable.

Secondly, the IF signal produced by combining the nonstandard frequency RF carrier and the nominal frequency local oscillator signal for the selected channel may have a picture carrier negatively offset from the nominal picture carrier within a predetermined range, e.g., −2 MHz. The negatively offset IF picture carrier corresponds to a positively offset RF picture carrier. Since the negatively offset picture carrier lies within the IF passband of typical IF circuitry which may be utilized in IF signal processing unit 20, a $\overline{FAR}$ signal and $\overline{WEAK}$ signal will be generated by far detector 80 and weak detector 82, respectively, during the duration of the SAMPLE signal. In response, mode control unti 36 will generate an AFT (Automatic Fine Tuning) signal to cause synchronous mode switch 38 to couple the output of divide-by-B divider 56 to phase detector 44 thereby initiating the operation of the second phase locked loop configuration. As a result, the frequency deviation between the picture carrier and its nominal value, e.g. 45.75 MHz, will be reduced by the second phase locked loop as previously described.

Thirdly, the IF signal produced by combining the nonstandard frequency RF carrier and the nominal frequency local oscillator signal may have a picture carrier positively offset from the nominal picture carrier frequency within a predetermined range, e.g., +2 MHz. The positively offset IF picture carrier corresponds to a negatively offset RF picture carrier. Since the typical IF circuitry which may be utilized in IF signal processing unit 20 attenuates signals above the nominal picture carrier frequency more than it attenuates signals below the nominal picture carrier frequency, under these conditions the picture carrier may lie outside the IF passband. However, the IF sound carrier which, for example, in the United States, is 4.5 MHz below the IF picture carrier, will be within the IF passband but more than 2 MHz from the nominal IF picture carrier frequency. Since the dominant carrier in the IF passband is greater than 2 MHz from the nominal IF picture carrier frequency, far detector 80 will generate a FAR signal during the duration of the SAMPLE signal. In response to the FAR signal, mode control unit 36 will generate a STEP signal during the duration of the SAMPLE signal which is coupled to divide-by-N control unit 50 to cause the value of N to be decreased by a value of 2. Correspondingly, the local oscillator frequency will be decreased by 2 MHz. As a result, the IF picture carrier will be shifted downward in frequency by 2 MHz and be brought within the IF passband. At this point, weak detector 82 will detect a strong signal and will in response generate a $\overline{WEAK}$ signal and far detector 80 will detect that the dominant carrier within the IF passband is within 2 MHz of 45.75 MHz and generate a $\overline{FAR}$ signal. In response to the $\overline{FAR}$ and $\overline{WEAK}$ signals, mode control unit 36 will initiate the operation of the second phase locked loop configuration by means of synchronous mode switch 38. Thereafter, the second phase locked loop configuration will minimize the frequency deviation between the IF picture carrier and 45.75 MHz.

Fourthly, the frequency of the RF carrier provided by RF input unit 12 may be equal or substantially equal to the frequency of the respective standard frequency RF carrier. As a result, the IF signal produced by combining the RF carrier and the nominal frequency local oscillator signal will have a nominally correct picture carrier frequency, i.e., a picture carrier having a frequency equal to or substantially equal to 45.75 MHz. Under these conditions, a $\overline{FAR}$ signal and a $\overline{WEAK}$ signal will be generated, as in the case of a negatively offset IF picture carrier, and the operation of the second phase locked loop will be initiated.

If, after the operation of the second phase locked loop configuration has been initiated, either a WEAK or a FAR signal is generated due to a temporary tuning aberration such as, for example, a temporary reduction in the amplitude of the RF signal, the operation of the second phase locked loop is terminated and the operation of the first phase locked loop is reinitiated. After the disappearance of the temporary tuning aberration, $\overline{WEAK}$ and $\overline{FAR}$ signals will again be generated and the operation of the second phase locked loop will be reinitiated. It is noted that the STEP signal is only terminated in response to a CHANGE signal. Therefore, if the operation of the second phase locked loop is temporarily interrupted while the operation of the first phase locked loop configuration is temporarily reinitiated due to a momentary condition, the value of N existing at the time the operation of the second phase locked loop was originally initiated is maintained. As a result, the necessity of generating another STEP signal, if one had already been generated to tune receiver 10, with the possibility of a tuning error, is avoided. It is noted, in this connection, that since once a decision has been made whether or not to generate a STEP signal for a particular channel, there is no reason for the decision to be altered thereafter. Therefore, to minimize the possibility of tuning the receiver to an undesired carrier such as an adjacent channel sound carrier, the generation of a STEP signal is inhibited after the SAMPLE interval.

Since MATV distribution signals do not generally translate the frequencies of RF carriers in the UHF range, it is not necessary to provide a capability of "fine " tuning UHF channels. Therefore, operation of the second phase locked loop configuration is not initiated if a channel in the UHF range has been selected. It will be appreciated, however, that tuning system 34 may be readily modified to provide a fine tuning capability for UHF channels whereby the operation of the second phase locked loop configuration is initiated to permit precise tuning of a strong non-standard frequency UHF carrier, translated in frequency from a respective standard frequency UHF carrier by an offset within a predetermined range, provided by RF input unit 12.

As earlier mentioned, when a viewer manually selects an inactive channel, i.e., one for which there is no carrier, the image produced by kinescope 32 will be a blank noisy (commonly referred to as "snow") raster. Similarly, when a viewer manually selects an illegal channel, i.e., channel 0, channel 1 or a channel above 83, the image produced by kinescope 32 will be a blank raster but with much less noise since the viewer has selected an inactive channel and neither VHF local oscillator 14 nor UHF local oscillator 16 is activated. Under these conditions, the viewer should manually select another channel to see if it provides a useable image. This manual searching process is annoying and time consuming. Therefore, tuning system 34 is provided with provisions to automatically locate and tune the next active channel above or below a previously tuned-in channel.

A viewer may initiate the atuomatic scanning mode (see FIG. 4) by depressing either an UP or DN (Down) key on channel selection keyboard 58. Depressing the UP botton will cause the channels to be scanned in increasing order while depressing the DN button will cause the channels to be scanned in decreasing order. Except for the order in which the channels are scanned, the two scanning modes are similar. Therefore, only the "UP" scanning mode will be described.

When a viewer depresses the UP botton, a CHANGE signal and a SEARCH signal are generated by scan control unit 60. The SEARCH signal is coupled to mode control unit 36. In response to the CHANGE signal, the channel number previously entered in scan control unit 60 is increased by 1 and its BCD representative signals are coupled to divide-by-N control unit 50 to correspondingly increase the value of N. Thus, for example, if channel 2 had been the previously tuned-in channel, if the UP button is depressed, the BCD signals representing the channel number entered in scan control unit 60 are altered from representing 2 to representing 3. Correspondingly, in the United States, for example, N would be increased from 101 to 107. The specific manner by which N is controlled will be subsequently explained. Furthermore, as in the manual channel selection mode, in response to the CHANGE signal, the LOCK and STEP signals are reset to $\overline{\text{LOCK}}$ and $\overline{\text{STEP}}$, respectively, and the WEAK signal is set to $\overline{\text{WEAK}}$. Furthermore, a HOLD signal, which will be later described, is reset to $\overline{\text{HOLD}}$. Thus, in the scanning mode, the CHANGE signal causes the initiation of the operation of the first phase locked loop configuration and the initialization of various other portions.

As in the manual channel selection mode, before the output signal of lock detector 78 is examined, there is a time delay, $T_1$, e.g., approximately 30 milliseconds, provided to allow sufficient time for the automatic gain control (AGC) circuitry (not shown) of RF input unit 12 and IF signal processing unit 20 to settle to a stable condition. After the delay, when the LOCK signal is generated, a SAMPLE signal having a predetermined duration, e.g., 20 milliseconds, is generated during which the output signals of far detector 80 and weak detector 82 are determined. After the termination of the SAMPLE signal, the output signals of far detector 80 and weak detector 82 are examined to determine the next step of the tuning sequence. Assuming that the channel being examined to determine whether it is tunable or not is in the VHF range, if $\overline{\text{WEAK}}$ and $\overline{\text{FAR}}$ signals have been generated, by the end of the SAMPLE signal, the SEARCH signal is reset terminating the scanning operation. In addition, the operation of the second phase locked loop is initiated in response to the generation of an AFT signal to "fine" tune receiver 10 as previously described. Note that if a FAR signal is generated during the SAMPLE signal, indicating a positively offset IF picture carrier, it will be generated during the early portion of the SAMPLE signal, and as a result, a STEP signal is immediately thereafter generated. As a result, the value of N is reduced by 2 and the positively offset picture carrier is shifted into the IF passband. Thereafter, following the SAMPLE signal, in response to the generation of $\overline{\text{WEAK}}$ and $\overline{\text{FAR}}$ signals, the scanning operation is terminated and the operation of the second phase locked loop is initiated to "fine" tune receiver 10. If $\overline{\text{FAR}}$ and $\overline{\text{WEAK}}$ signals have been generated by the end of the SAMPLE signal, indicating either that the channel is inactive or that the signal is too weak, i.e., noisy, to permit reliable operation of the second phase locked loop, an ADVANCE signal is generated internally within scan control unit 60 (as will later be explained) and the channel number is increased by 1 and the tuning sequence is repeated. The channel number is successively increased by 1 until a tunable channel is located and tuned.

In the scanning mode, when a channel presently being examined to determine whether or not it is tunable is in the UHF range, as in the manual channel selection mode, the operation of the second phase locked loop configuration is not initiated because under these conditions fine tuning is not typically required. Therefore, under these conditions, without additional provisions, scanning would be terminated.

So that scanning is not erroneously terminated on an inactive or an unoccupied UHF channel for which spurious signals may be present in the IF passband due to such causes as intermodulation distortion or insufficient signal image rejection, far detector 80 is utilized to determine if there is a signal more than 0.4 MHz from 45.75 MHz. The U signal is coupled to far detector 80 to selectively enable far detector 80 to detect a frequency deviation of more than 0.4 rather than 2 MHz under these conditions. Since carriers in the UHF range derived from MATV signals will normally provide an IF picture carrier having a frequency substantially equal to the picture carrier frequency, e.g., 45.75 MHz, when combined with the nominal frequency local oscillator signal of the associated channel, if there is a signal more than 0.4 MHz from 45.75 MHz, it indicates the presence of a spurious signal to which it is undesirable to tune receiver 10. The value 0.4 MHz is utilized because it has been found that spurious signals undesirably present in the IF passband typically occur at frequencies greater than 0.4 MHz from 45.75 MHz. When a WEAK or a FAR signal is generated in the scanning mode before the end of the SAMPLE signal when a UHF channel is being scanned (see FIG. 5), an ADVANCE signal is generated at the end of the SAMPLE signal to alter the value of N to a value corresponding to the next channel.

As will be explained, the band in which a channel resides and whether or not the channel is an illegal one is determined during each cycle of the divide-by-N output signal generated by divide-by-N control unit 50. If, during the scanning mode, it is determined that the channel presently being examined is illegal, an ADVANCE signal is generated at a predetermined portion of the divide-by-N output signal. Since the divide-by-N output signal has a relatively high frequency, i.e., $f_{LO}/KN$, as the channels are scanned, illegal channels are rapidly skipped over.

When MATV switch 76 is in the disable position, the tuning sequence is essentially the same as the tuning sequence when MATV switch 76 is in the enable position with two exceptions. Firstly, in response to an $\overline{MATV}$ signal, indicating that MATV switch 76 is in the disable position, far detector 80 detects when there is a dominant carrier within ±0.4 MHz from 45.75 MHz rather than when there is a dominant carrier within ±2 MHz of 45.75 MHz. Secondly, in response to an $\overline{MATV}$ signal, mode control unit 76 inhibits the generation of a STEP signal. Thus, when a channel is manually selected and MATV switch 76 is in the disable position, the second phase locked loop configuration is only enabled when the RF input signal is sufficiently strong, i.e., free of noise, to ensure reliable operation of the second phase locked loop configuration and when the dominant carrier in the IF passband for the nominal value of N for the selected channel has a frequency within ±0.4 MHz of 45.75 MHz. The latter condition prevents tuning system 34 from tuning receiver 10 to spurious signals which may be undesirably present in the passband due to causes such as intermodulation distortion or insufficient signal image rejection. Similarly, in the scanning mode of operation, when MATV switch 76 is in the disable position, scanning is terminated and the operation of the second phase locked loop configuration is enabled when the RF input signal is sufficiently strong to ensure the reliable operation of the second phase locked loop configuration and the dominant carrier in the IF passband for the nominal value of N for the channel presently being examined to determine whether or not it is tunable is within ±0.4 MHz of 45.75 MHz to ensure that receiver 10 is not tuned to spurious signals undesirably present in the IF passband.

A divide-by-N control unit similar to divide-by-N control unit 50 is described in detail in U.S. patent application Ser. No. 662,097 entitled, "Programming Unit for a Television Tuning Phase Locked Loop" filed in the name of R. M. Rast on Feb. 27, 1976, hereby incorporated by reference. Briefly, one cycle of the divide-by-N output signal of divide-by-N control unit 50 has a duration equal to the duration of N cycles of the output signal of divide-by-K prescaler 48. For example, in the United States, if channel 2 is selected, divide-by-N control unit 50 forms the divide-by-N output signal by counting 101 (101 being the nominal frequency in MHz of the local oscillator signal corresponding to channel 2) cycles of the output signal of prescaler 48.

Divide-by-N control unit 50 makes advantageous use of the frequency allocations of the nominal local oscillator signals. In the United States, for example, the nominal frequency local oscillator signals corresponding to the various channels a viewer may select are located in four separate frequency bands. The nominal frequency local oscillator signals for channels 2–4 are located in a first band, for channels 5–6 in a second band, for channels 7–13 in a third band and 14–83 in a fourth band. The VHF range includes the first three bands and the UHF range includes the fourth band. In each band the nominal local oscillator frequencies are separated at 6 MHz intervals. A cycle of the divide-by-N output signal includes a first portion, e.g., a logic "high" level, having a duration determined by the selected channel number and a second portion, e.g., a logic "low" level, having a duration determined by the band in which the selected channel resides.

The first portion is formed by dividing the frequency of the output signal of prescaler 48 by 6 by means of a dual modulus divider 64 until BCD output signals representing the count accumulated in a dual decade counter 66 match the BCD chamber number representative signals coupled to channel number comparator 62. At this point, a CHANNEL MATCH signal marking the end of the first or channel portion is coupled to a counter control unit 68 from channel number comparator 62. In response, counter control unit 68 causes dual decade counter 66 to be reset and dual modulus divider 64 to divide by 7 until a first predetermined number of counts determined by the band in which the selected channel resides are accumulated in dual decade counter 66. When the first predetermined number of counts is reached, ÷7 STOP signal is generated by divide-by-7 comparator 70. In response, counter control 68 causes dual modulus divider 64 to divide by 6 once again. At this point dual decade counter 66 is not reset but rather continues to accumulate counts until a second predetermined number of counts also determined by the band in which the selected channel resides is detected by an offset number comparator 72. At this point, in response to an OFFSET MATCH signal generated by offset number comparator 72 marking the end of the second or band portion, counter control 68 resets dual decade counter 66 and the divide-by-N cycle is complete.

The BCD signals generated by dual decade counter 66 are also coupled to a band decoder unit 74 which, during the channel portion of the divide-by-N output signal, recognizes when the count accumulated in dual decade counter 66 has a value that equals the count corresponding to channel numbers 2, 5, 7, 13 or illegal channel number 84, i.e., the boundaries of the four legal bands and the illegal band above 83. At the end of the channel portion manifested by the generation of a CHANNEL MATCH signal, band decoder 74 determines which, if any, of the boundary counts has been exceeded and generates a signal representing which band the selected channel is in to control other portions of the divide-by-N divider 50. Furthermore, for channels in the VHF bands a V signal is generated and for channels in the UHF band a U signal is generated. If no boundary count has been generated, i.e., illegal channel 0 or 1 has been selected, or the boundary count for the illegal band above channel number 83 has been generated, an ILLEGAL signal is generated. The V, U and ILLEGAL signals to various portions of tuning system 34 control their operation.

In response to a STEP signal, the first predetermined value to which the counts accumulated are compared in divide-by-7 comparator 70 is decreased by 2. As a result, the value of N is correspondingly decreased by 2.

The OFFSET MATCH signal generated by offset number comparator 72 is coupled to scan control unit 60 and is gated with the ILLEGAL signal to cause illegal channel numbers to be rapidly skipped over at the relatively fast rate of $f_{LO}/NK$ during the scanning mode.

The OFFSET MATCH signal is also coupled to synchronous mode switch 38. In response, a SYNCH 1 signal is coupled to divide-by-B divider 56 to cause the output signal of divide-by-B divider 56 to be instantaneously synchronized with the divide-by-N output signal of divide-by-N control unit 50 before the output signal of divide-by-B divider 56 is coupled to phase detector 44 to initiate the operation of the second phase locked loop configuration. At this point the first phase locked loop configuration is in a locked condition, i.e., the divide-by-N output signal is substantially synchronized with the reference frequency signal. Therefore, the divide-by-B output signal is instantaneously synchronized with the reference frequency signal when the operation of the second phase locked loop is initially enabled. This initial synchronization minimizes undue tuning delays due to the generation of an incorrect control voltage by phase detector 44 when the operation of the second phase locked loop is initially enabled. Similarly, synchronous mode switch 38 couples a SYNCH 2 signal to divide-by-K prescaler 48 to synchronize the divide-by-N output signal with the reference signal when the operation of the first phase locked loop is enabled when a new channel is being tuned or after the channel has been fine tuned by the second phase locked loop configuration and there is a temporary tuning aberration causing the operation of the second phase locked loop to be temporarily interrupted. The synchronization operation of synchronous mode switch 38 is more fully described in the aforementioned Rast applications.

Figure 6:
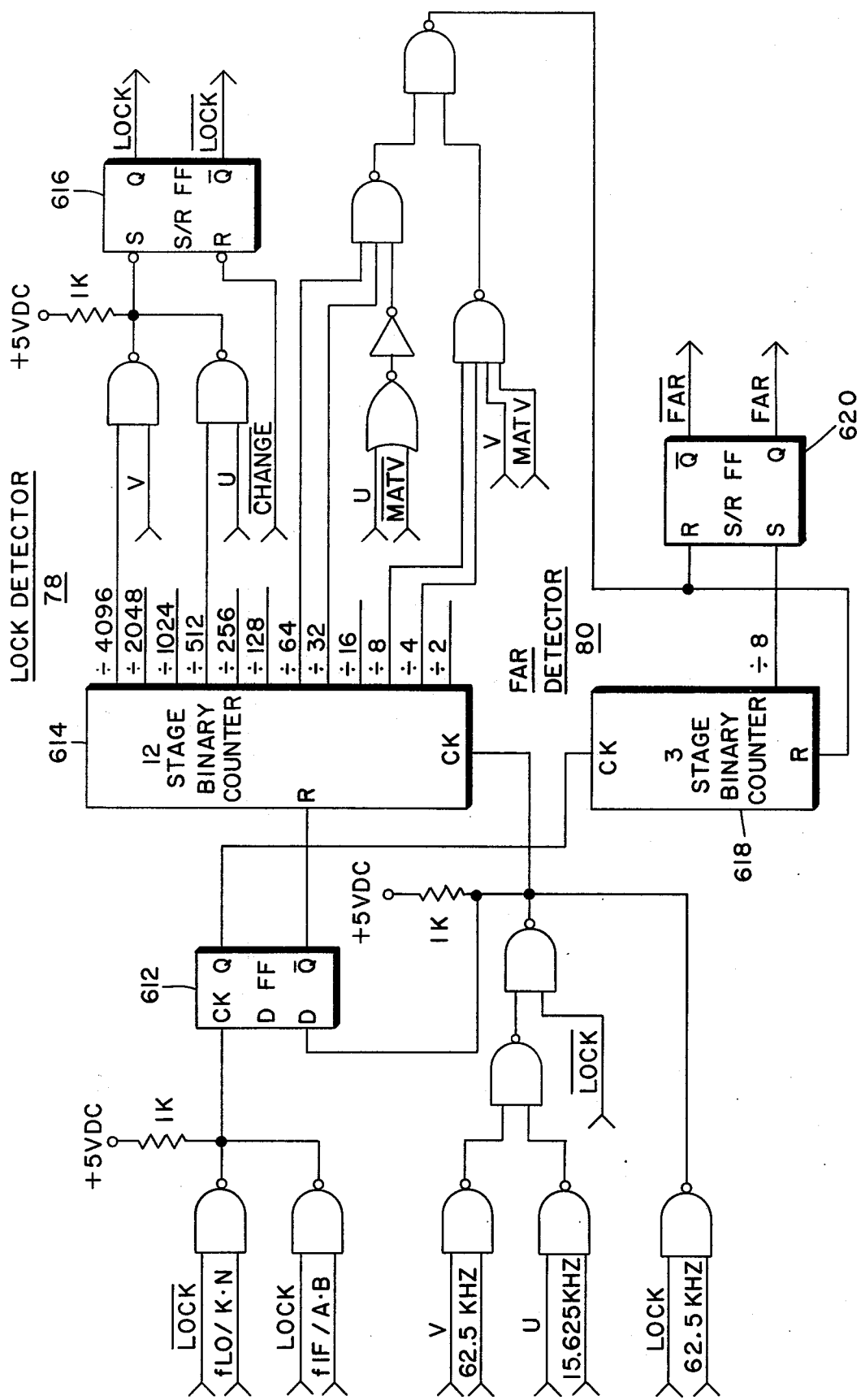
FIGS. 6–9 are schematic diagrams of various portions of the tuning system shown in FIG. 1.
Figure 7:
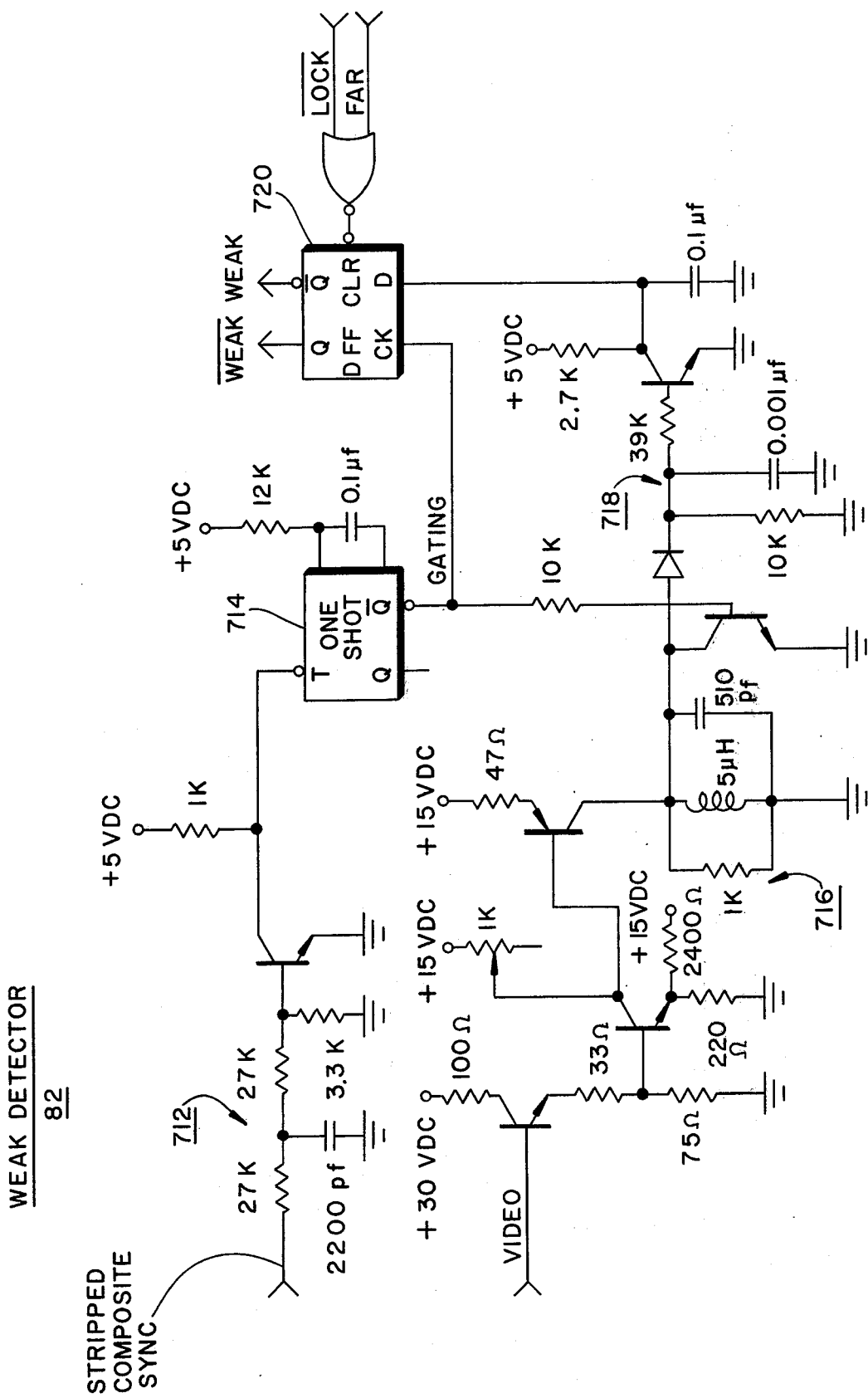

The logic arrangement of FIG. 6, utilizing conventional logic elements well known in the art, selectively provides the lock and far detection functions earlier described. The arrangement is similar to an arrangement described in U.S. Pat. application Ser. No. 709,924 entitled, "Digital Frequency Deviation Detector Useful in a Television Tuning System," filed in the name of J. Tults on July 29, 1976, hereby incorporated by reference. For the lock detection function, in response to a $\overline{\text{LOCK}}$ signal developed at the output of lock detector 78 in response to a negative going $\overline{\text{CHANGE}}$ pulse, the divide-by-N output signal of divide-by-N control unit 50, having a frequency $f_{LO}/KN$ is coupled to the clock (CK) input of a data flip-flop (D FF) 612. If the channel presently being tuned is in the VHF range, the 62.5 KHz reference frequency signal generated by reference divider 42 is coupled to the data (D) input of D FF 612. If the channel presently being tuned is in the UHF range, the 15.625 KHz reference frequency signal generated by reference divider 42 is coupled to the D input of D FF 612. D FF 612 generates a frequency difference signal having a frequency equal to the difference between the frequencies of the divide-by-N output signal and the enabled reference frequency signal at its $\overline{Q}$ output.

The enabled reference frequency signal is coupled to the CK input of a binary counter 614 including at least 12 stages. The frequency difference signal is coupled to the reset (R) input of binary counter 614. Binary counter 614 counts cycles of the enabled reference frequency signal during the negative half cycle of the frequency difference signal. When the frequency difference between the enabled reference frequency signal and the divide-by-N output signal is small, the number of cycles counted by binary counter 614 will be large. Since the enabled reference frequency signal is related by a fixed number to the frequency of the reference signal, a locked condition is manifested by the accumulation of a predetermined number of counted cycles, dependent on the band in which the channel presently being tuned resides. When the predetermined count (4096 for channels in the VHF band and 512 for channels in the UHF band) is reached, a corresponding signal is coupled to the set (S) input of a set-reset flip-flop (S/R FF) 616 and a LOCK signal is generated at its set (Q) output. S/R FF 616 is reset by a negative going $\overline{\text{CHANGE}}$ pulse. The lock detection function takes at least 30 milliseconds ($T_1$) with the predetermined counts specified above.

For the far detection function, in response to a LOCK signal the output signal of divide-by-B divider 56 is coupled to the CK input of D FF 612 and the 62.5 KHz reference frequency signal is coupled to its D input and to the CK input of binary counter 614. In response, cycles of the 62.5 KHz reference frequency signal are counted during the negative-going half cycle of the frequency difference signal generated at the $\overline{Q}$ output of D FF 612 and coupled to the R input of binary counter 614. Under these conditions, the number of counted cycles represented is inversely related to the difference between the frequency $f_{IF}/A \cdot B$ of the divide-by-B output signal and 62.5 KHz. When MATV switch 76 is in the MATV enable position and the channel presently being tuned is in the VHF range, a count of 12 corresponds to a frequency deviation of approximately 2 MHz. When MATV switch 76 is in the MATV disable position or the channel presently being tuned is in the UHF range, a count of 96 corresponds to a frequency deviation of approximately 0.4 MHz.

The Q output of D FF 612 is coupled to the CK input of a 3-stage binary counter 618 and the outputs of binary counter 614 representing the various counts described above are to its R input. The 8 count output of binary counter 618 is coupled to the S input of S/R FF 620 while the output of binary counter 614 representing the various counts described above are coupled to its R output. Binary counter 618 determines when three consecutive cycles of the frequency difference signal have occurred without one of the counts having been reached. If not, a FAR signal is generated at the Q output of S/R FF 620. If so, a $\overline{\text{FAR}}$ signal is generated at the $\overline{Q}$ output of S/R FF 620.

The implementation of weak detector 82 is similar to the weak detector described in the aforementioned Rast application Ser. No. 662,096. It includes an integrator 712 coupled to a stripped composite synchronization (sync) signal, including only vertical and horizontal sync pulses derived by sync processing unit 30. Integrator 712 integrates the stripped composite synchronization signal to provicde a pulse which corresponds to the vertial blanking pulse conventionally generated in a receiver when a picture carrier is within the passband of the IF portion of the receiver. The output of integrator 712 is coupled to a monostable or one-shot multivibrator 714 which provides a GATING PULSE signal which rises immediately following the pulse generated by integrator 712.

Weak detector 82 is also responsive to a video signal provided by video detector 26. The video output signal is amplified and bandpass filtered by a circuit 716 to remove synchronization and color components therefrom. The filtered signal is coupled to a peak detector 718 in response to the GATING pulse. If the received RF carrier is strong, noise content of the video signal during the vertical blanking pulse will be relatively low and the peak detected signal wil have a relatively low amplitude. However, if the received RF signal is weak, the noise content will be relatively high and the peak detected signal will have a relatively large amplitude. If the peak detected signal has a sufficiently low amplitude, a D FF 720, having its D input coupled to the output of peak detector 718, will develop a $\overline{\text{WEAK}}$ signal at its Q output. If not, a WEAK signal is developed at the $\overline{\text{Q}}$ output of D FF 720. Thus, by determining the peak value of noise present during the GATING PULSE interval, weak detector 82 provides an indication of whether a strong or weak signal is present. The $\overline{\text{WEAK}}$ signal is reset when either a $\overline{\text{LOCK}}$ or FAR signal is coupled to the clear (CLR) input of D FF 720 so that the operation of the second phase locked loop configuration is not enabled when the first phase locked loop is not yet locked or when the dominant carrier in the IF passband is more than 2 MHz from 45.75 MHz.

Figure 8:
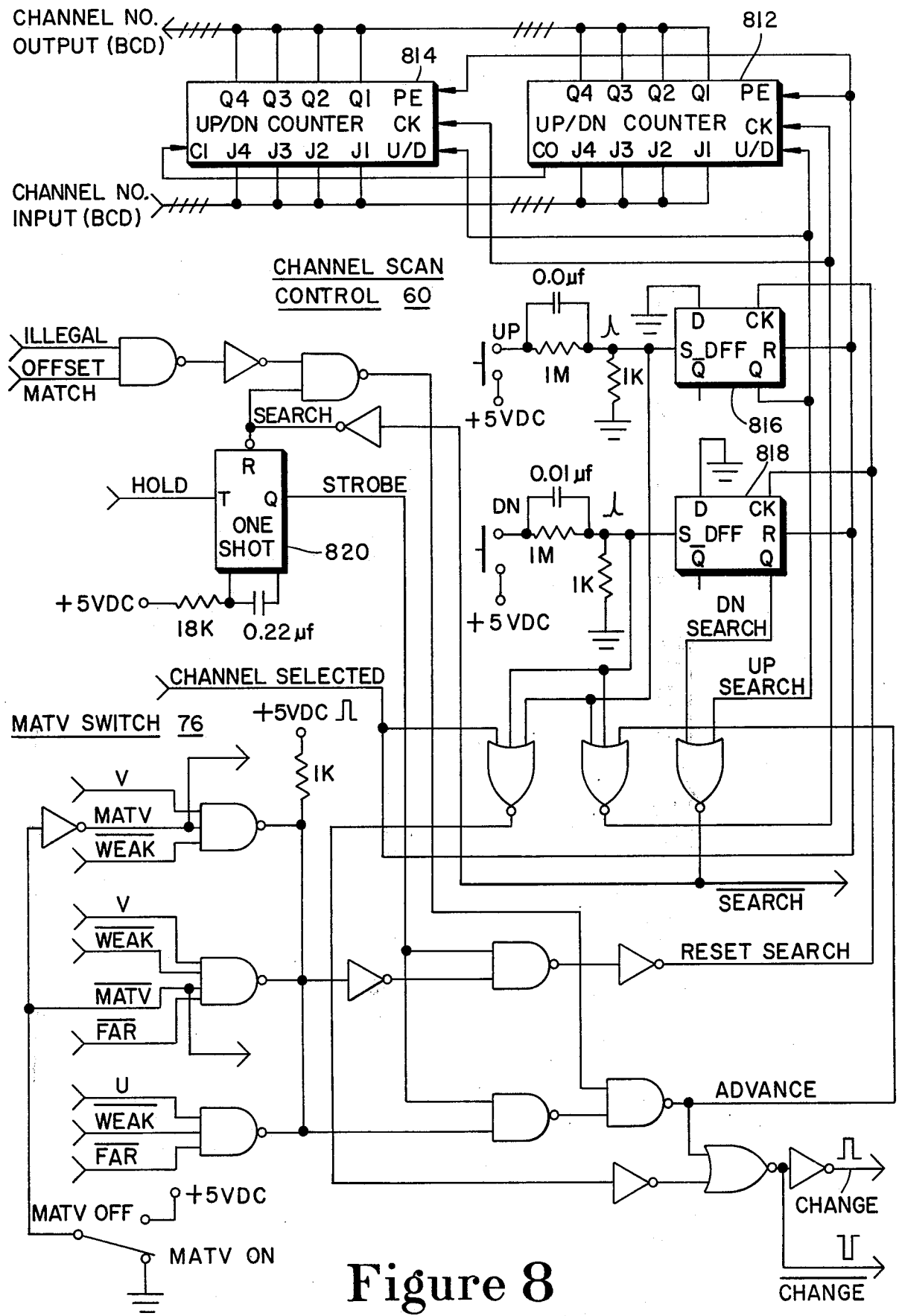
Figure 9:
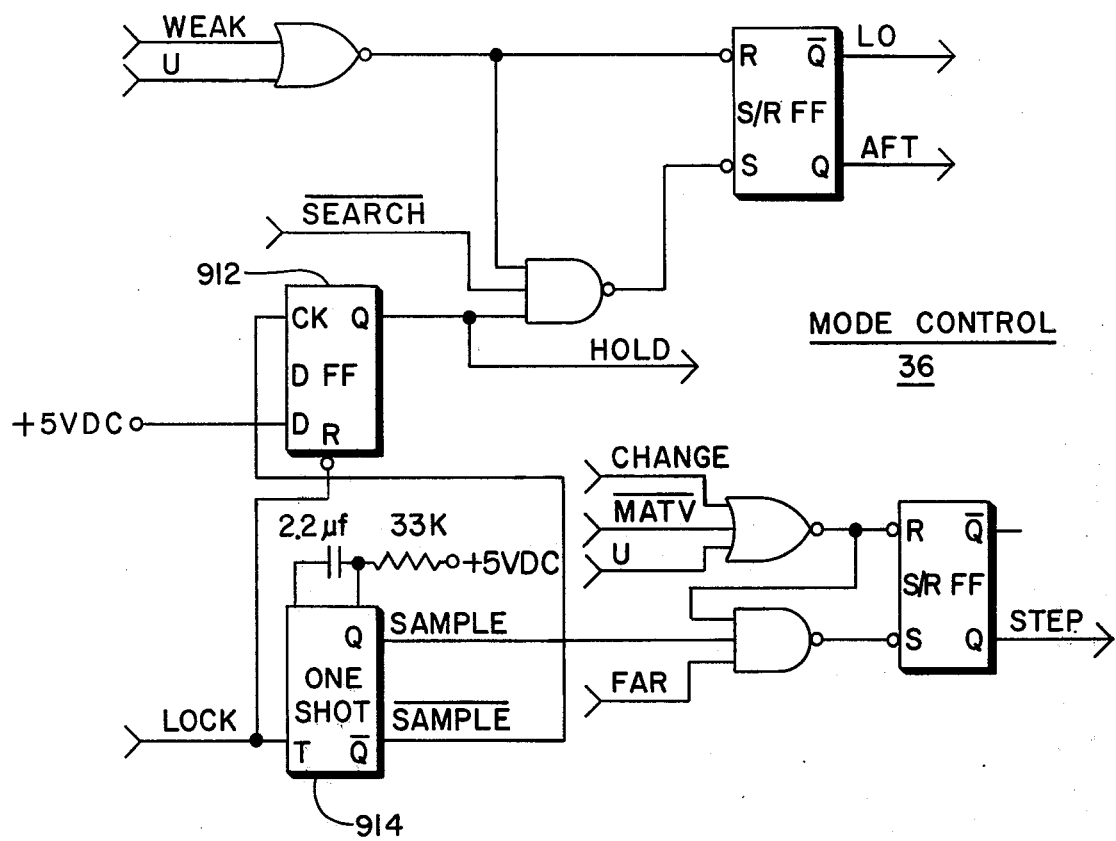

The logic implementation of MATV switch 76 and channel scan control unit 60 of FIG. 8 and mode control unit 36 of FIG. 9 utilize conventional logic elements. These logic implementations are arranged to provide the tuning algorithm previously described and represented in the flow chart of FIG. 2 and the waveforms of FIGS. 3, 4 and 5 and therefore do not require further detailed description. However, descriptions of certain portions thereof may be helpful in gaining a better understanding of tuning system 34 of FIG. 1.

Channel scan control unit 60 of FIG. 8 includes an up/down counter 812 having J1-J4 jam inputs in which the four BCD signals (indicated by cross marks) representing the least significant digit of the channel number are coupled from channel selection keyboard 58 and an up/down counter 814 having J1-J4 jam inputs to which the four BCD signals (indicated by cross marks) representing the most significant digit of the channel number are coupled from channel selection keyboard 58. The two up/down counters may comprise, for example, a CD4029 integrated circuit presettable up/down counter commercially available from the RCA Corporation. The carry out (CO) output of up/down counter 812 is coupled to the carry in (CI) input of up/down counter 814. When a positive-going CHANNEL SELECTED pulse, generated by channel selection keyboard 58 after a channel is selected, is coupled to the preset enable (PE) inputs of up/down counters 812 and 814, the BCD signals at their J1-J4 jam inputs are coupled to their Q1-Q4 outputs. When a high logic level is applied to the up/down (U/D) inputs of up/down counters 812 and 814 in response to the setting of a programmable D FF 816 by depressing the UP scan button, up/down counters are enabled to count up. Otherwise they are enabled to count down. The number represented by th BCD output signals of up/down counters 812 and 814 is increased or decreased, depending on the level of the signal applied to the U/D input, by 1 when either the UP scan or DN scan button is depressed or when an ADVANCE signal is generated.

A SEARCH signal is generated when either programmable D FF 816 or a programmable D FF 818 are set in response to either depressing the UP scan or DN scan button, respectively. An ADVANCE signal can be generated after the generation of a SEARCH signal in response to either the generation of a STROBE signal or the generation of an ILLEGAL signal and OFFSET MATCH signal. A STROBE signal is generated by a monostable or one-shot multivibrator in response to the generation of a HOLD signal by mode control unit 36.

In the implementation of mode control unit 36 of FIG. 9, a HOLD signal is generated by a programmable D FF 912 in response to the generation of a $\overline{\text{SAMPLE}}$ signal marking the termination of a SAMPLE signal. A SAMPLE signal is generated by a one-shot multivibrator 914 in response to the generation of a LOCK signal and terminates at the time $T_2$ later. As earlier described, the time constant associated with one-shot multivibrator 914 is selected so that $T_2$ is sufficiently long to permit weak detector 82 to evaluated the strength of the RF signal. Since the vertical interval during which the RF signal strength is determined is typically 16.7 milliseconds, a suitable value for $T_2$ is 20 milliseconds. The remaining portions of the logic implementations have already been described with reference to the flow chart of FIG. 2 and the timing diagrams of FIGS. 3-5.

What is claimed is:

1. An apparatus for tuning a receiver capable of receiving a plurality of stations having station numbers associated therewith, comprising:

local oscillator means for generating a local oscillator signal;

mixer means for combining said local oscillator signal with a radio frequency carrier associated with a station being tuned to generate an intermediate frequency signal having at least one information bearing carrier;

intermediate frequency signal processing means having a predetermined passboard for processing said intermediate frequency signal;

first phase locked loop means for selectively controlling the frequency of said local oscillator signal in accordance with the station number associated with the station presently being tuned;

second phase locked loop means for selectively controlling the frequency of said local oscillator signal to reduce a frequency deviation between said information bearing carrier and a fixed frequency;

weak detector means for generating a weak signal representing the amplitude of said radio frequency carrier;

far detector means for generating a far signal representing the frequency deviation between the frequency of a dominant intermediate frequency signal component in said intermediate frequency passband and said fixed frequency;

switching means responsive to said far and weak signals for selectively enabling the operation of one of said first and second phase locked loop means; and scanning means responsive to said far and said weak signals for successively changing the station number;

said scanning means being inhibited from changing the station number and said switching means enabling the operation of said second phase locked loop means when the amplitude of said radio frequency signal is greater than a predetermined threshold amplitude and the frequency of said dominant intermediate frequency signal component is within a predetermined frequency deviation from said fixed frequency determined by the expected range of a frequency offset between the frequency of said radio frequency carrier and its standard value.

2. The apparatus recited in claim 1 wherein
said scanning means is inhibited from changing the station number and said switching means enables the operation of said second phase locked loop means when the amplitude of said radio frequency signal is greater than said predetermined threshold amplitude and the frequency of said dominant intermediate frequency signal component is within a first frequency deviation from said fixed frequency for a frequency offset between the frequency of said radio frequency carrier and its standard value in a first range and within a second frequency deviation from said fixed frequency for a frequency offset between the frequency of said radio frequency carrier and its standard value in a second range.

3. The apparatus recited in claim 2 wherein
said first frequency deviation is approximately equal to said first range; and
said second frequency deviation is less than the expected minimum frequency deviation between the frequency of a spurious intermediate frequency signal component to which it is undersirable to tune said receiver and said fixed frequency.

4. The apparatus recited in claim 3 wherein
said first phase locked loop means changes the local oscillator frequency by a predetermined increment when the frequency of said dominant intermediate frequency signal component is greater than said first frequency deviation from said fixed frequency.

5. The apparatus recited in claim 4 wherein said predetermined increment is substantially equal to said first frequency deviation.

6. The apparatus recited in claim 5 wherein said local oscillator frequency is reduced by said first phase locked loop means when the frequency of said dominant intermediate frequency signal component is greater than said first frequency deviation from said fixed frequency.

7. The apparatus recited in claim 1 wherein
lock detection means are provided for generating a lock signal when said first phase locked loop means is in a locked condition; and
said switching means is responsive to said lock signal, said second phase locked loop being enabled only when said first phase locked loop is in a locked condition, the amplitude of said radio frequency signal is greater than said predetermined threshold amplitude and the frequency of said dominant intermediate frequency signal component is within said predetermined frequency deviation from said fixed frequency; and
said scanning means is responsive to said lock signal, said scanning means changing the station number until said first phase locked loop is in a locked condition, the amplitude of said radio frequency signal is greater than said predetermined threshold amplitude and the frequency of said dominant intermediate frequency signal component is within said predetermined frequency deviation from said fixed frequency.

8. The apparatus recited in claim 1 wherein
said first phase locked loop means includes means for generating an illegal signal when the station number corresponds to a station to which said receiver is not capable of being tuned; and
said scanning means includes means to generate an advance signal to change the station number, said advance signal normally being generated in response to a strobe signal, said strobe signal being generated after a predetermined time interval having a duration longer than the time required to generate said far and weak signals, said advance signal being selectively generated in response to said illegal signal, said illegal signal having a period shorter than said predetermined time interval.

9. The apparatus recited in claim 8 wherein
said first phase locked loop means includes means for dividing the frequency of said local oscillator signal by a number proportional to the nominal local oscillator frequency for the station being tuned and means for comparing the frequency of the resultant signal with the frequency of a reference frequency signal to derive a first control signal for controlling the frequency of said local oscillator signal;
said means for dividing the frequency of said local oscillator signal by a number proportional to the frequency of the station being tuned including counter means for counting a first number of cycles of said local oscillator signal related to the station number during a first interval and a second number of cycles of said local oscillator signal related to the frequency band of the station being tuned during a second interval;
said counter means includes means for generating a band boundary marker signal when the first number of counted cycles corresponds to the boundary of a frequency band in which a station may reside and means for terminating a previously generated band boundary marker signal in response to a subsequently band boundary marker signal; and
said means for generating a band boundary marker signal includes means for generating said illegal signal when no band boundary marker signal exists at the end of said first interval.

10. The apparatus recited in claim 9 wherein said means for generating said advance signal includes means for generating said advance signal in response to the generation of said illegal signal and the occurrence of the end of said second interval.

11. The apparatus recited in claim 1 wherein said weak detector means includes means for generating said weak signal in response to the amplitude of noise signal components present in said intermediate frequency passband.

12. The apparatus recited in claim 2 wherein said far detector means includes
means for generating a reference frequency signal;
means for generating a proportional frequency signal having a frequency proportional to the frequency of said dominant intermediate frequency signal component in said intermediate frequency passaband;
means for generating a frequency difference signal having a frequency substantially equal to the difference between the frequency of said reference signal and said proportional frequency signal;
means for counting cycles of said reference frequency signal during a predetermined portion of said frequency difference signal; and
means for comparing the number of counted cycles to a first number when the frequency offset between the frequency of said radio frequency carrier and its standard value is in said first range and to a second number when the frequency offset is in said second range.

* * * * *

UNITED STATES PATENT OFFICE
CERTIFICATE OF CORRECTION

PATENT NO. : 4,077,008

DATED : February 28, 1978

INVENTOR(S) : Robert Morgan Rast, et al.

It is certified that error appears in the above-identified patent and that said Letters Patent are hereby corrected as shown below:

Column 4, line 11, that portion reading ",$f_{IF} = (AB/R) f_{XTAL} = ABf_{REF}$ (2)" should read -- $f_{IF} = (AB/R) f_{XTAL} = \frac{AB}{x} f_{REF}$ (2) --; Column 5, line 44, that portion reading "frequency" should read -- frequency --; Column 7, line 45, that portion reading "unti" should read -- unit --; Column 9, line 26, that portion reading "atuomatic" should read -- automatic --; line 30, that portion reading "botton" should read -- button --; Column 12, line 14, that portion reading "chamber" should read -- channel --; Column 14, line 53, that portion reading "provicde" should read -- provide --; Column 16, line 29, that portion reading "passboard" should read -- passband --; Column 18, lines 30 and 31, that portion reading "subsequently band" should read -- subsequently generated band --; lines 52 and 53, that portion reading "passaband" should read -- passband --.

Signed and Sealed this

Eighteenth Day of July 1978

[SEAL]

Attest:

RUTH C. MASON
*Attesting Officer*

DONALD W. BANNER
*Commissioner of Patents and Trademarks*